(12) United States Patent
Hwang

(10) Patent No.: US 7,223,660 B2
(45) Date of Patent: May 29, 2007

(54) FLASH ASSISTED ANNEALING

(75) Inventor: Jack Hwang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 505 days.

(21) Appl. No.: 10/210,866

(22) Filed: Jul. 31, 2002

(65) Prior Publication Data

US 2004/0023418 A1    Feb. 5, 2004

(51) Int. Cl.
*H01L 21/336*    (2006.01)

(52) U.S. Cl. ................... 438/289; 257/E21.2

(58) Field of Classification Search ............... 606/10; 219/390; 438/486
See application file for complete search history.

(56) References Cited

U.S. PATENT DOCUMENTS

| | | | | |
|---|---|---|---|---|
| 4,915,765 A * | 4/1990 | Metters | ................ | 156/267 |
| 5,474,940 A * | 12/1995 | Tsukamoto | ................ | 438/289 |
| 5,612,251 A * | 3/1997 | Lee | ................ | 438/795 |
| 6,179,465 B1 * | 1/2001 | Yam | ................ | 374/2 |
| 6,222,990 B1 * | 4/2001 | Guardado et al. | ................ | 392/416 |
| 6,482,199 B1 * | 11/2002 | Neev | ................ | 606/10 |
| 6,570,656 B1 * | 5/2003 | Owens et al. | ................ | 356/445 |
| 6,849,831 B2 * | 2/2005 | Timans et al. | ................ | 219/390 |
| 7,015,422 B2 * | 3/2006 | Timans | ................ | 219/390 |
| 2002/0137311 A1 * | 9/2002 | Timans | ................ | 438/487 |

* cited by examiner

*Primary Examiner*—Walter Lindsay, Jr.
*Assistant Examiner*—Andre' Stevenson
(74) *Attorney, Agent, or Firm*—Trop, Pruner & Hu, P.C.

(57) ABSTRACT

The present disclosure relates to a rapid thermal processing system that may be useful for processing semiconductor devices. A flash lamp may be utilized to provide pulse heating of a semiconductor for annealing or other purposes. A sensor may be provided to sense a characteristic of a semiconductor when a pre-pulse is applied to the semiconductor. Subsequent pulses may then be adjusted based on the characteristic sensed by the sensor.

6 Claims, 5 Drawing Sheets

FLASH ASSISTED ANNEALING

FIELD OF THE INVENTION

This disclosure relates to semiconductor rapid thermal processing. In particular this disclosure relates to annealing semiconductor wafers and other semiconductor devices.

BACKGROUND

Many individual process steps are required to produce a satisfactory semiconductor transistor. One such process is the annealing process wherein the temperature of the semiconductor die or wafer, as the case may be, is brought to a sufficient elevated temperature for the annealing process to be effective. However, there are many variations in semiconductor devices such as die layout and film stack variations, which tend to make each semiconductor device, die layout and film stack respond differently than previous and subsequent devices.

For example one wafer may contain a plurality of sections each of which may become a microprocessor in subsequent processing. While another wafer may contain areas that may become flash memory devices in subsequent processing stages. Therefore, as between the two wafers, there may be a multitude of variations in patterns, number of layers, and other differences. These differences may result in each wafer requiring more or less energy to achieve an adequate annealing temperature.

These variations are particularly troublesome with flash assisted annealing in the sub-melt regieme for silicon. In the flash anneal process, a high intensity lamp is utilized to inject thermal energy sufficient to achieve the annealing process quickly enough to heat only the surface of the wafer and not the bulk. The final peak surface temperature is a critical parameter of the system. Too much energy can melt the transistors. However, the changes in wafers as discussed previously may result in differences of reflectivity of the surfaces that can significantly affect the peak surface temperature achieved in the process. Also, variations in the amount of light originating from the flash lamp system also lead to unacceptable variations in the peak surface temperature.

Therefore, what is needed is a method and apparatus for controlling the flash anneal process and other improvements in semiconductor processing.

DETAILED DESCRIPTION

Figure 1:
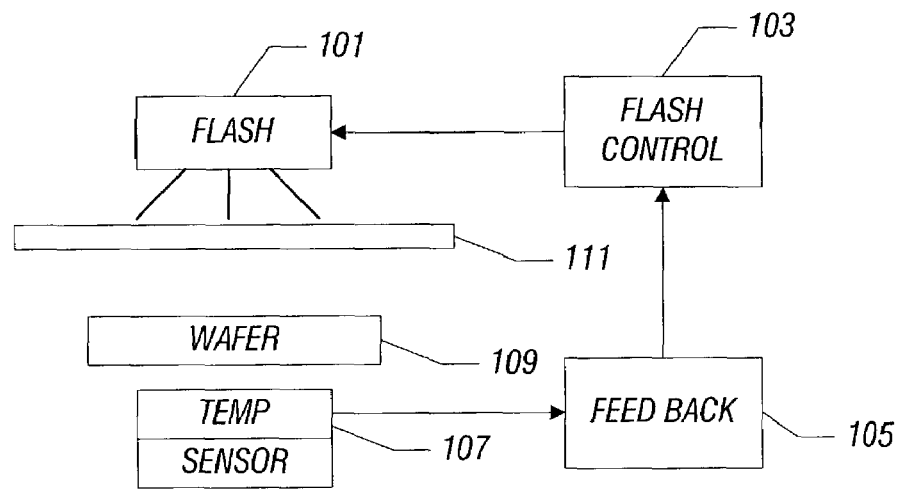
FIG. 1 is a block diagram of a flash annealing process according to embodiments of the present invention.

Referring now to FIG. 1, a flash lamp 101 is coupled to a flash controller 103. The flash controller 103 is also coupled to a feedback circuit 105 that is in turn coupled to a semiconductor temperature sensor 107.

The flash 101 may be any suitable flash device such as an arc lamp, laser light generator or other light source that is capable of the power output on a time scale shorter than required for heat to diffuse from the front surface of the wafer to the backside. The flash lamp 101 illuminates wafer 109 such that the temperature of the surface of wafer 109 is elevated. In this context, wafer shall be used in a broadly to cover a wafer, die or other semiconductor device. The degree of thermal elevation may be detected by temperature sensor 107 which may be processed by feedback circuit 105. The feedback circuit 105 may then provide a signal to the flash controller 103 such that the duration of flashes, number of flashes, or combinations of duration and number of flashes may be adjusted as required by a particular wafer for effective annealing. In some embodiments, the temperature sensor 107 may monitor the temperature of the backside of the wafer 109 where the frontside of wafer 109 is a surface, which is being annealed. The flash 101 may be configured such that it is isolated from a processing chamber (not shown) by a glass or quartz window 111.

Figure 2:
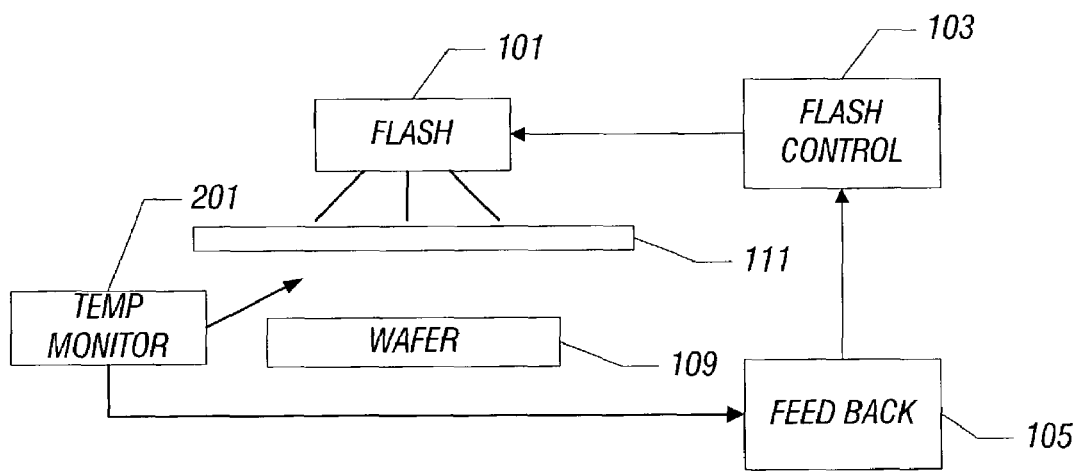
FIG. 2 is a block diagram of a flash annealing process using frontside semiconductor monitoring according to embodiments of the present invention.

Referring now to FIG. 2, flash 101, flash controller 103, feedback 105 and wafer 109 may be as described previously. However, sensor 201 may be operative, in some embodiments, to monitor the frontside of wafer 109. Again, the frontside of wafer 109 is the side that may be subjected to the annealing process. The sensor 201 may monitor a number of parameters of the frontside of the wafer, for example, the wafer monitor 201 may detect the reflectivity of the surface of one or more areas of wafer 109. In other embodiments, wafer monitor 201 may monitor the surface temperature of one or more areas of the frontside of wafer 109. Alternatively, the sensor may monitor both the reflectivity and temperature of the wafer 109.

In a flash assist annealing process, the wafer bulk may be elevated to a preset temperature or temperature range after which the flash, such as flash 101, may then be pulsed to elevate the surface temperature of the wafer to a target temperature or temperature range. Either the backside temperature of the wafer or the surface temperature of the wafer may be utilized, in some embodiments, to determine the wafer temperature before the flash anneal pulses, and the effect of the flash anneal pulses, on the wafer.

Figure 3:
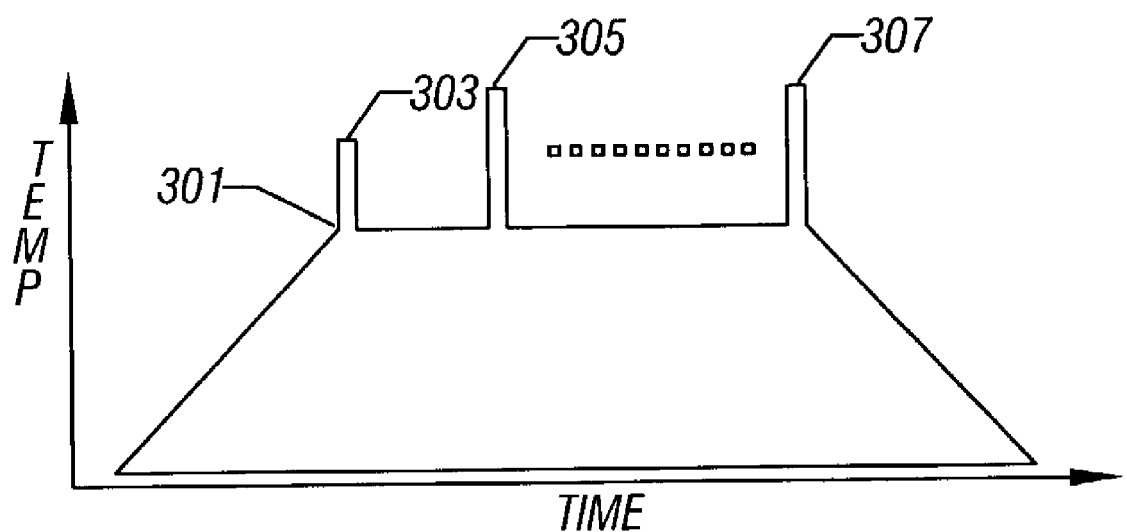
FIG. 3 is a graph of wafer temperature v. time of a semiconductor device according to embodiments of the present invention.

Referring now to FIG. 3, a temperature vs. time graph of a wafer according to some embodiments of the present invention is illustrated. The temperature of the wafer such as wafer 109 is elevated to a floor temperature range 301. In some embodiments, this range may between approximately 300 and 1000 degrees centigrade. This may be considered an intermediate temperature. After the wafer has risen to the intermediate temperature, in some embodiments, a monitor pulse 303 is produced. This pulse may be produced by flashing a lamp such as an arc lamp 101. The monitor pulse may be controlled such that it is at a reduced amplitude such that it will not to exceed a critical surface temperature jump that would affect transistor processing. The effect of this first pulse, that may be considered a pre-pulse, may be utilized to determine the reflectivity of one or more areas of the wafer.

In other embodiments, the pre-pulse may be utilized to determine the temperature rise of the surface of the wafer from the pre-pulse.

By monitoring the effect of the pre-pulse on the surface of the wafer, the feedback circuit such as circuit 105 may generate a signal that may be utilized by the flash control 103 to control the amplitude of the subsequent flash pulse to achieve the desired annealing affect. This process can be repeated iteratively if the system is configured to run multiple pulses in the wafer process. Each subsequent pulse can be modulated based on the prior pulse if there is a long term drift to the system. If there is a degree of variability in the pulse amplitude, then multiple pulses can be run to achieve improved control of the average energy deposited in the system. In some embodiments, the target temperature for annealing may be approximately 1300 degrees centigrade for a period, which may be between approximately 0.1–5.0 milliseconds. For the above mentioned reasons, pulses 305–307 may be utilized to raise the surface temperature of the wafer to the desired annealing temperature.

Figure 4:
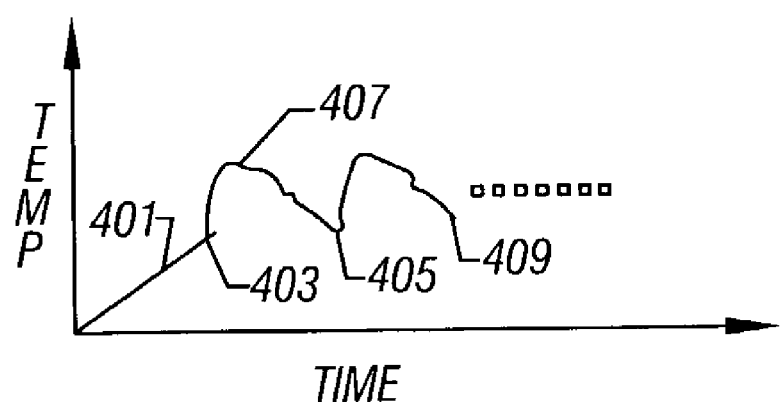
FIG. 4 is a graph of the temperature v. time of the backside of a semiconductor device according to embodiments of the present invention.

Referring now to FIG. 4, the measurement of the backside of a wafer, such as wafer 109, during a flash assisted annealing process may be represented by the graph line 401, depending on the spacing of the light pulses. As illustrated, immediately following the flash pulse, there is no increase in the surface temperature on the backside. As the surface temperature of the silicon begins to equilibrate with the bulk, the backside temperature rises until point 403 when it is in equilibrium with the surface. The period between point 403 through approximately point 405 may represent the temperature of the backside of the wafer as a result of a flash pulse on the frontside of the wafer. Thus pulse (not shown) may generate a temperature peak at point 407 at which point the temperature of the wafer may decrease to point 405. The bulk temperature jump as indicated by point 407 is the best measure of the total energy deposited in the system and is the quantity used to feed back to the controller the magnitude of the adjustment of the subsequent pulse. The period from points 405 to 409 may represent the result of a second flash pulse on the frontside of the wafer. Typically, in some embodiments, multiple peaks will occur as multiple flash pulses are utilized to anneal of the wafer.

If the system has the wafer on a hot plate, backside temperature measurement is may not possible. In this configuration, the surface temperature may be used as the control quantity. The processing sequence may be as follows: Place wafer on hot plate ex ~500C for a few seconds. Adjust surface pyrometer (temperature) to 500C. since this quantity is now known. It may not be enough to be able to measure the emmisivity only at 500C because it is a function of temperature and varies with material type (i.e., silicon nitride or polysilicon, etc . . . ). The quantity of interest, in some embodiments, is the emmisivity from the intermediate temperature to the peak temperature since this is what controls the final peak temperature.

Flash wafer surface to approximately 1300c with the lamp. During this flash process, the light from the flash lamp may dominate the signal from the photodetector. Measure the light intensity with time to measure the lamp time profile which can be used as a monitor of the light pulse intensity and deconvolute this with the wafer emmisivity. The flash pulse should last no longer than a few milliseconds. As the hot surface equilibrates with the bulk wafer (~20 milliseconds), the bulk temperature rise is on the order of ~50C which will cool down on a time frame of about 1 second. This bulk temperature rise will appear as a discontinuity on the second time frame if you draw the flash lamp process on the same time scale. This magnitude of the bulk temperature rise is the quantity which will indicate the peak surface temperature if we know the pulse profile and is the control quantity of interest.

Figure 5:
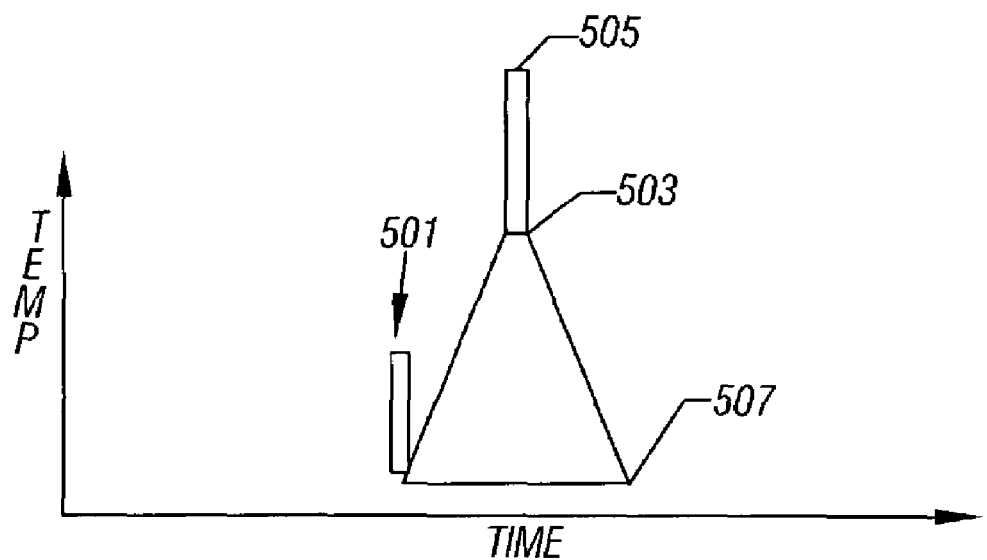
FIG. 5 is a graph of temperature v. time of a semiconductor device according to embodiments of the present invention.

Referring now to FIG. 5, in some embodiments, it may be desirable to measure wafer reflectivity with the wafer at approximately room temperature. While at approximately room temperature, a pre-pulse 501 may be utilized to measure the reflectivity of the wafer 109. After the reflectivity is measured, the wafer may be brought up to an intermediate temperature such as at point 503. After the wafer has reached an intermediate temperature, then a flash pulse such as a pulse at approximately point 505 may be triggered to increase a surface temperature to the desired level. After one or more pulses such as occurs at time 505, the wafer is allowed to cool back to an approximately room temperature such as represented by point 507. As before, the pulses such as occurs at point in time 505 may be adjusted based on the feedback of reflectivity from the pulse that occurred at point 501.

Figure 6:
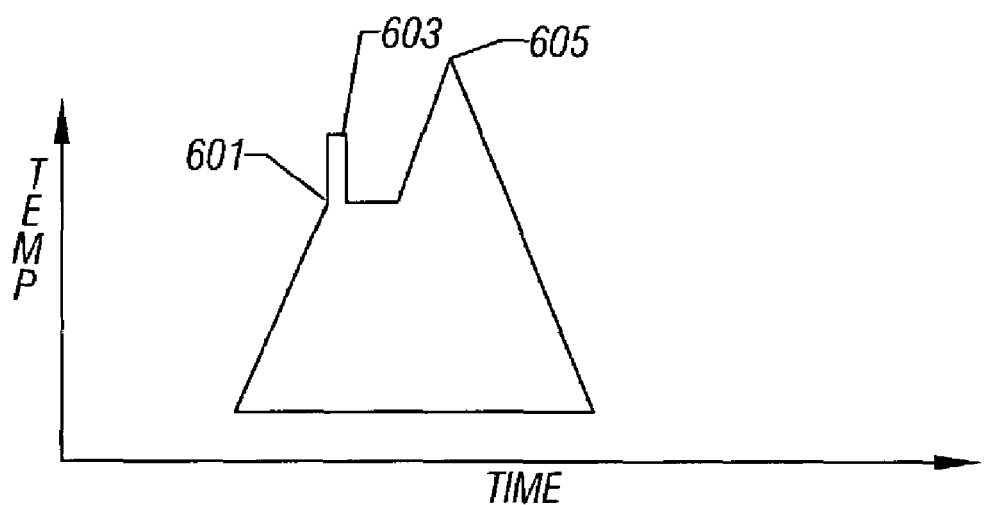
FIG. 6 is graphs of temperature v. time for a wafer anneal process according to embodiments of the present invention.

Referring now to FIG. 6, the wafer may be brought up to a low intermediate temperature. Once the low intermediate temperature has been reached by the wafer, a pre-pulse such as may occur at point 603 may be triggered. After the pre-pulse has occurred, the wafer may then be taken up to an intermediate temperature 605 thereupon one or more flash pulses may be utilized as described before to anneal the wafer. In this example, the results of pre-pulse 603 may be utilized to control the duration and/or the number of subsequent pulses that may occur once the wafer has reached approximately an intermediate temperature.

Figure 7:
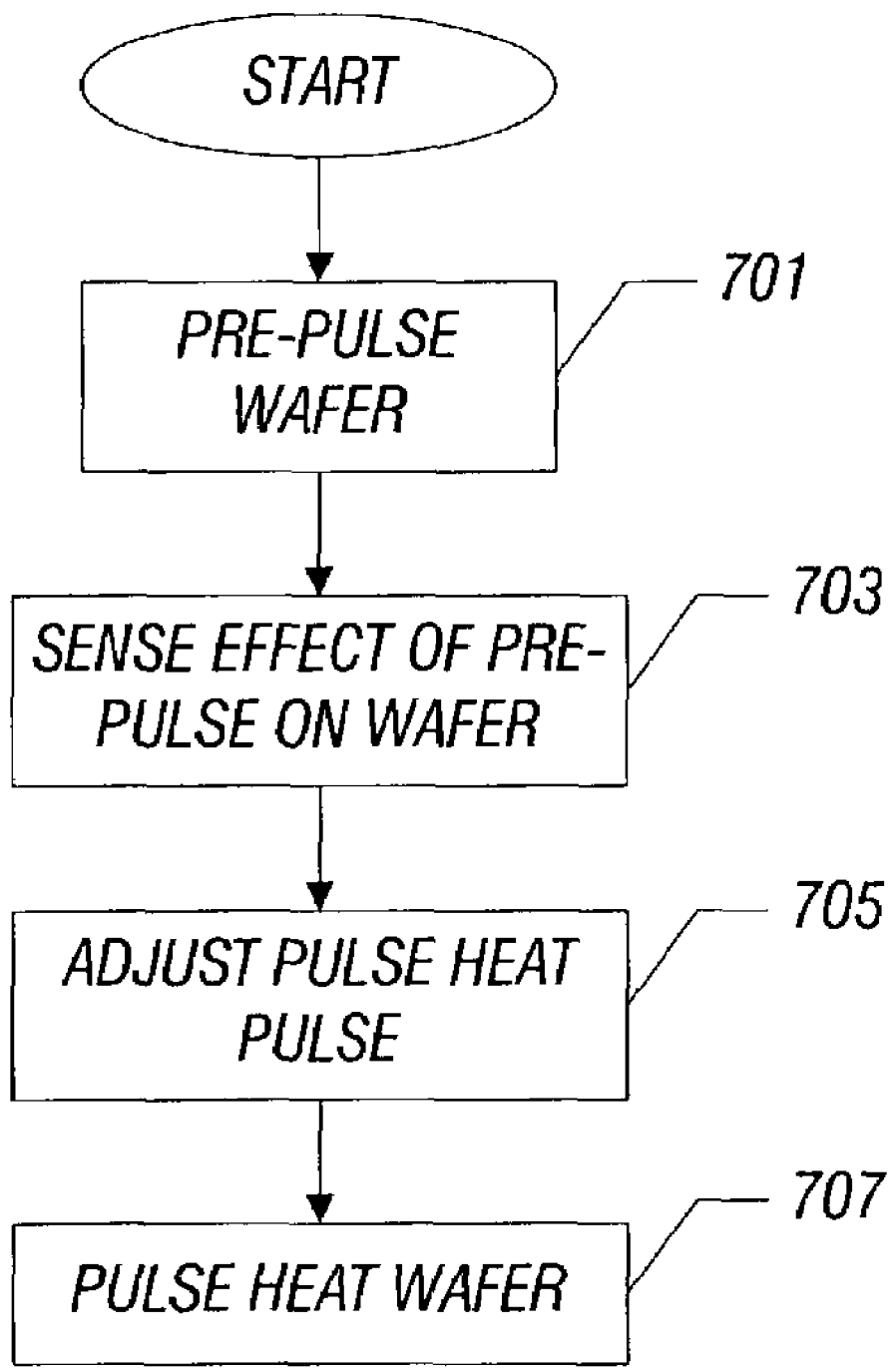
FIG. 7 is a flow chart of an annealing process according to embodiments of the invention.

Referring now to FIG. 7, in some embodiments, a pre-pulse 701 is applied to a wafer. The result of the pre-pulse is sensed 703 and utilized to adjust subsequent pulses 705. The adjustments may be as described above. Then, in some embodiments, additional pulses are then utilized to anneal the wafer 707.

Figure 8:
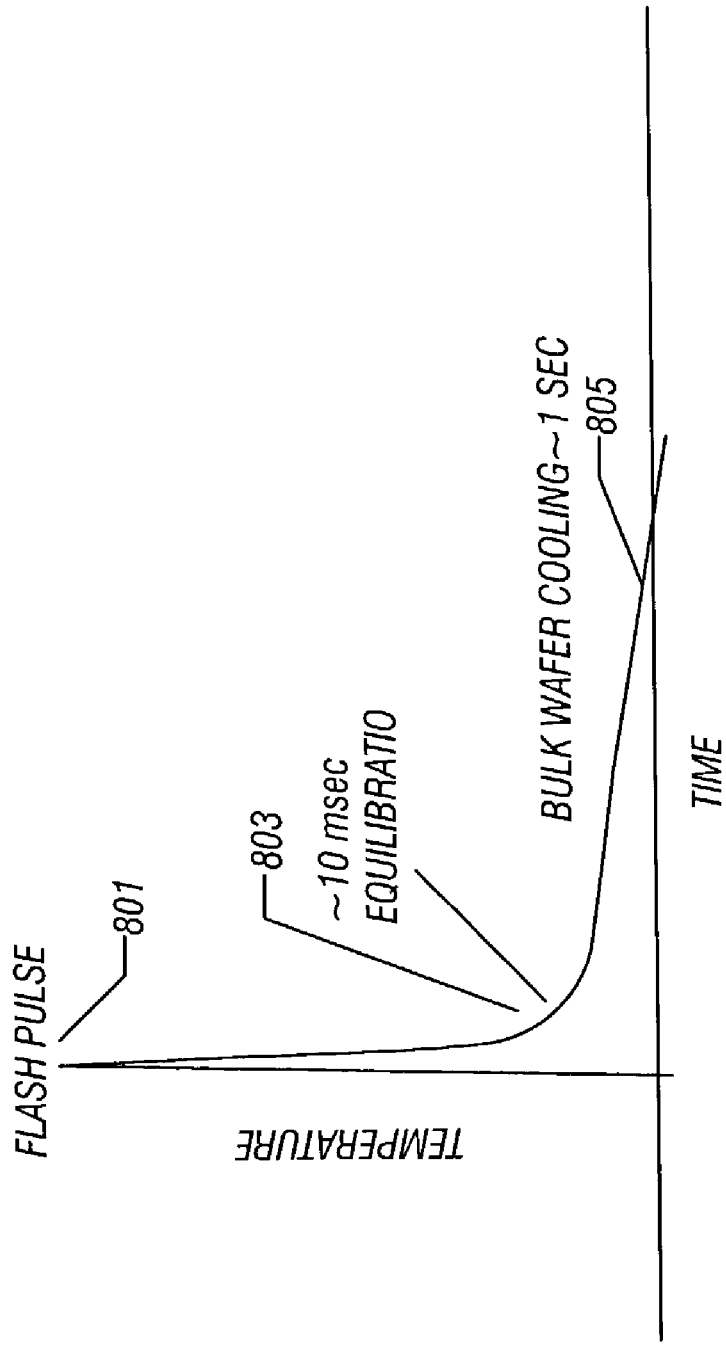
FIG. 8 is a surface temperature vs. time chart according to embodiments of the invention.

Referring now to FIG. 8, in some embodiments, a flash pulse at time 801 is triggered that increased the surface temperature of a wafer. A short time there after, such as at point of time 803, the surface temperature has substantially decreased. The surface temperature of the wafer continues to decrease as indicated at time 805.

In the above described embodiments, the effect of the pre-pulse on the wafer may be detected by a temperature sensor or reflectometer monitoring the upper surface being annealed or, in other embodiments, may be monitored by a temperature sensor monitoring the temperature of the backside of the wafer. As was previously described, the results of the pre-pulse may be utilized to control subsequent flash pulses that may then be utilized to anneal the frontside of a wafer such as wafer 109. This adjustment of subsequent pulses by monitoring the result of a pre-pulse may be utilized, in some embodiments, to compensate for changes in the flash lamp such as lamp 101 due to age or other factors. In addition, this adjustment of the flash pulses may be utilized, as described before, to compensate for wafer-to-wafer differences.

While the present invention has been described with respect to a limited number of embodiments, those skilled in the art will appreciate numerous modifications and variations there from. It is intended that the appended claims cover all such modifications and variations as fall within the true spirit and scope of this present invention.

What is claimed is:

1. A method comprising:

heating a wafer to a first temperature;

sensing the temperature of said heated wafer within a processing chamber in response to a monitor pulse from a pulse heat source; and heating the wafer with additional pulses from the pulse heat source based, in part, on the sensed temperature of the wafer, said additional pulses having a higher amplitude than said monitor pulse.

2. The method of claim 1, including sensing the temperature of the wafer having a frontside and a backside.

3. The method of claim 2, wherein sensing the temperature of the wafer includes sensing the temperature of the frontside of the object.

4. The method of claim 2, wherein sensing the temperature of the wafer includes sensing the temperature of the backside of the wafer.

5. The method of claim 1, wherein sensing the temperature of the wafer includes sensing the reflectivity of the wafer.

6. The method of claim 1, heating the wafer with additional pulses from the pulse heat source includes heating the wafer with pulses from a lamp.

* * * * *